United States Patent [19]

Takemura

[11] Patent Number: 5,627,402

[45] Date of Patent: May 6, 1997

[54] VARIABLE-CAPACITANCE DEVICE AND SEMICONDUCTOR INTEGRATED CIRCUIT DEVICE HAVING SUCH VARIABLE-CAPACITANCE DEVICE

[75] Inventor: Hisashi Takemura, Tokyo, Japan

[73] Assignee: NEC Corporation, Tokyo, Japan

[21] Appl. No.: 520,738

[22] Filed: Aug. 29, 1995

Related U.S. Application Data

[62] Division of Ser. No. 341,141, Nov. 16, 1994, Pat. No. 5,506,442.

[30] Foreign Application Priority Data

Nov. 25, 1993 [JP] Japan ..................................... 5-295428

[51] Int. Cl.$^6$ .............................. H01L 29/93; H01L 21/90
[52] U.S. Cl. ........................... 257/596; 438/379; 438/936
[58] Field of Search .................................... 257/595–600; 437/81, 108, 110, 904, 964

[56] References Cited

U.S. PATENT DOCUMENTS

| | | |
|---|---|---|
| 4,449,141 | 5/1984 | Sato et al. . |
| 4,954,850 | 9/1990 | Kasahara . |
| 5,338,966 | 8/1994 | Kasahara . |

FOREIGN PATENT DOCUMENTS

| | | | |
|---|---|---|---|
| 53-13370 | 2/1978 | Japan | ..................................... 257/596 |
| 58-162071 | 9/1983 | Japan . | |
| 60-245282 | 12/1985 | Japan . | |
| 61-81674 | 4/1986 | Japan . | |

OTHER PUBLICATIONS

S. M. Sze, *Semiconductor Devices Physics and Technology*, John Wiley & Sons, New York (1985) pp. 325–326.

*Primary Examiner*—J. Carroll
*Attorney, Agent, or Firm*—Young & Thompson

[57] ABSTRACT

A variable-capacitance device has an n-type diffusion layer which has an impurity concentration profile such that a region where the impurity concentration remains substantially constant and a region where the impurity concentration changes abruptly are alternately repeated, and the impurity concentration increases as the deepness from the surface increases. The impurity concentration profile can be achieved by implanting n-type impurity atoms a plurality of times with different energies in an ion implantation process or varying the concentration of n-type impurity atoms such as of phosphorus added upon epitaxial layer growth. The variable-capacitance device, and a semiconductor integrated circuit device composed of a plurality of such variable-capacitance devices can be fabricated on a semiconductor substrate, and are highly stable.

2 Claims, 9 Drawing Sheets

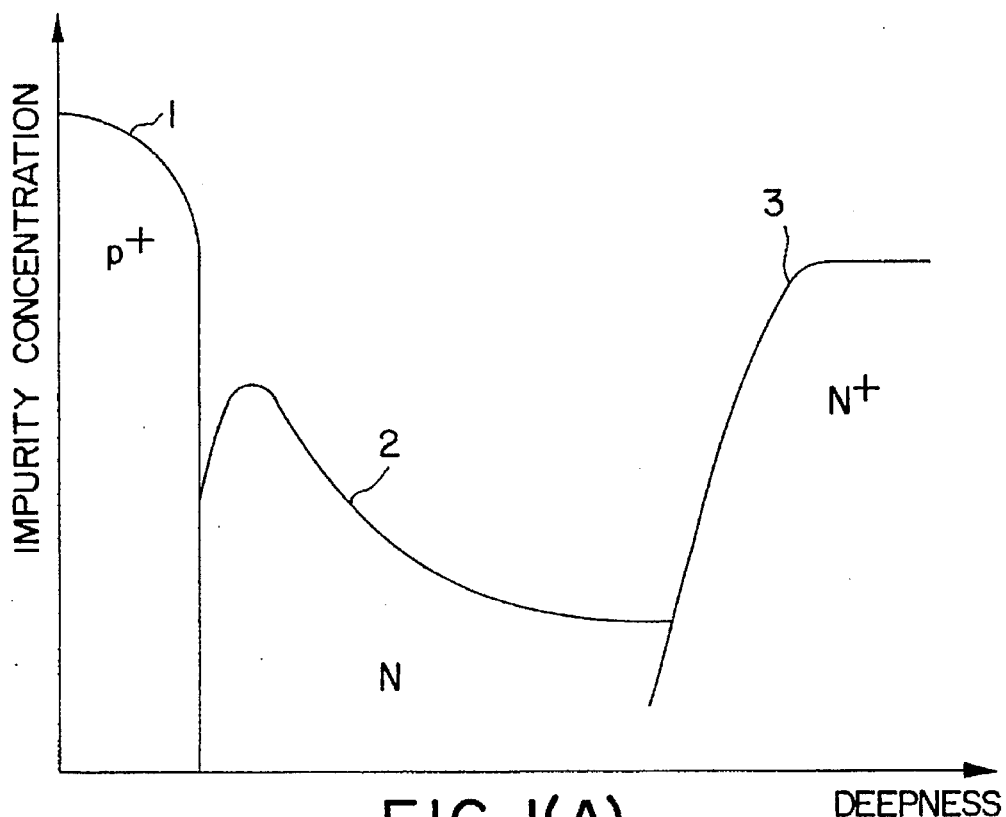
FIG. I(A)
(PRIOR ART)
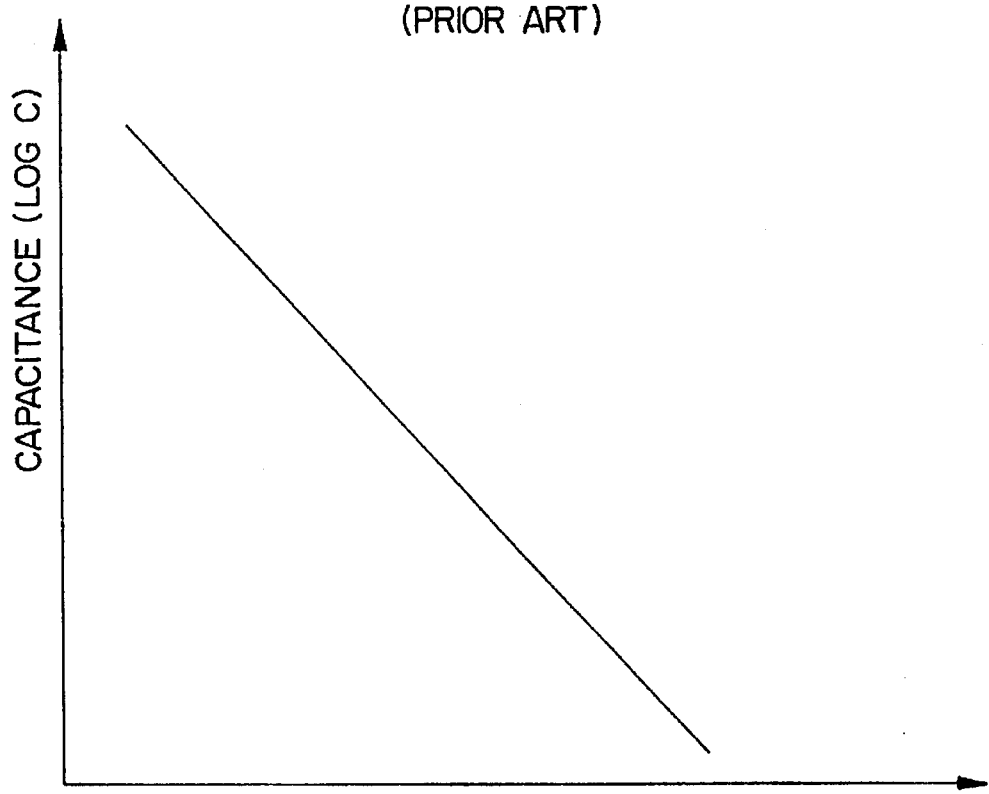
FIG. I(B)
(PRIOR ART)

VARIABLE-CAPACITANCE DEVICE AND SEMICONDUCTOR INTEGRATED CIRCUIT DEVICE HAVING SUCH VARIABLE-CAPACITANCE DEVICE

This application is a division of application Ser. No. 08/341,141, filed Nov. 16, 1994, U.S. Pat. No. 5,506,442.

BACKGROUND OF THE INVENTION

1. Field of the Invention

The present invention relates to a variable-capacitance device and a semiconductor integrated circuit device having such a variable-capacitance device.

2. Description of the Related Art

Heretofore, many variable-capacitance devices formed on semiconductor substrates are in the form of a variable-capacitance diode whose capacitance can be controlled by an impressed voltage using the diffusion capacitance of a pn junction. In a variable-capacitance diode having a diffusion layer of a hyper abrupt junction whose impurity concentration is reduced perpendicularly from the surface of a pn junction, for example, the capacitance of the pn junction uniformly varies exponentially as the impressed voltage varies. More specifically, as shown in FIG. 1(A) of the accompanying drawings, a conventional variable-capacitance diode comprises a p-type diffusion layer 1 of high impurity concentration, an n-type diffusion layer 2 forming a hyper abrupt junction with the p-type diffusion layer 1, and a buried $n^+$ region 3, each of the layers 1, 2 and the region 3 having an impurity concentration profile as shown. The capacitance C of the variable-capacitance diode shown in FIG. 1(A) uniformly varies exponentially as the impressed voltage V varies as shown in FIG. 1(B) of the accompanying drawings. In FIG. 1(B), the abscissa and ordinate indicate logarithmic representations. The capacitance C of the variable-capacitance diode and the impressed voltage V satisfies the following relationship:

$$C = C_D \cdot (V_D - V)^{-n} \quad (1)$$

where $C_D$ is a proportionality constant determined by the impurity concentration profile, and $V_D$ is the diffusion potential. Since the exponent "n" in the equation (1) can have a large value of "1" or "2" with the hyper abrupt junction, the capacitance C varies at a large rate of change as the impressed voltage V varies.

FIG. 2(A) is a cross-sectional view of another conventional variable-capacitance device.

The conventional variable-capacitance device, generally denoted at 500 in FIG. 2(A), for example, as described in Japanese Patent Specification No. 245282/85 has a capacitance which varies stepwise as the impressed voltage varies as shown in FIG. 2(B). The variable-capacitance device 500 comprises a semi-insulating substrate 501, an operating layer 502 formed in the semi-insulating substrate 501 and having a region whose deepness varies stepwise from the surface thereof underneath an anode electrode 505, an insulating film 503 formed on the surface of the semi-insulating substrate 501, a cathode electrode 504 formed on the insulating film 503 and extending through an opening defined in the insulating film 503 in electric connection to a deeper region (shown on a left-hand side) of the operating layer 502, and the anode electrode 505 which is formed on the insulating film 503 and extends through an opening defined in the insulating film 503 in electric connection to the region (shown on a right-hand side) of the operating layer 502 whose deepness varies stepwise.

When an anode voltage $V_A$ is applied to the anode electrode 505, the depletion layer spreads vertically in the direction of depth from the anode electrode 505. The capacitance C is determined by the depth of the depletion layer and the spread area thereof. Therefore, when the depletion layer spreads to the left further from the region of the operating layer 502 whose deepness varies stepwise, the capacitance C is abruptly reduced because the effective spread of the depletion layer is reduced in the stepped region. Consequently, when the anode voltage $V_A$ is increased, since the capacitance C is quickly reduced as the depletion layer spreads to the left further from the region of the operating layer 502 whose deepness varies stepwise, the capacitance C of the variable-capacitance device 500 varies stepwise as the anode voltage $V_A$ varies as shown in FIG. 2(B). In FIG. 2(B), the abscissa and ordinate indicate logarithmic representations.

In the above variable-capacitance diode with the diffusion layer of a hyper abrupt junction whose impurity concentration is reduced perpendicularly from the surface of the pn junction as shown in FIG. 1(A), the capacitance C varies at a certain ratio as the anode voltage $V_A$ varies as shown in FIG. 1(B). Therefore, the variable-capacitance diode can have a desired capacitance based on the anode voltage $V_A$. One problem, however, is that when the anode voltage $V_A$ varies, the capacitance C shifts from a desired capacitance.

On the other hand, the variable-capacitance device 500 shown in FIG. 2(A) is disadvantageous in that a plurality of selective ion implantation steps using different mask patterns are required to form the operating layer 502 whose deepness varies stepwise, and hence the fabrication process is complex. The variable-capacitance device 500 cannot practically employ a silicon substrate because if the substrate in which the operating layer 502 is formed were not the semi-insulating substrate 501, the depletion layer would spread downwardly of the operating layer 502 and an avalanche breakdown would occur. Furthermore, inasmuch as the deepness of the operating layer 502 differs stepwise, sufficient efforts have not been made to reduce a change in the capacitance brought about by a change in the anode voltage $V_A$ in regions where the capacitance is relatively flat in FIG. 2(B), though it is possible to vary the capacitance stepwise as the anode voltage $V_A$ varies.

SUMMARY OF THE INVENTION

It is therefore an object of the present invention to provide a variable-capacitance device which can be formed on a semiconductor substrate and has excellent stability, and a semiconductor integrated circuit device having such a variable-capacitance device.

To achieve the above object, there is provided in accordance with the present invention a variable-capacitance device comprising a semiconductor substrate, a first-conductivity-type region disposed on the semiconductor substrate, a second-conductivity-type region disposed on the first-conductivity-type region, the first-conductivity-type region and the second-conductivity-type region having a junction therebetween which has a capacitance variable in response to a change in an impressed voltage applied thereto, the first-conductivity-type region having an impurity concentration which varies in a direction perpendicular from a surface of the first-conductivity-type region such that a region where the capacitance varies to a large extent in response to the change in the impressed voltage and a region where the capacitance remains substantially constant in response to the change in the impressed voltage are alternately repeated.

The impurity concentration may increases stepwise in the direction perpendicular from the surface of the first-conductivity-type region.

Alternatively, the impurity concentration may decrease continuously in the direction perpendicular from the surface of the first-conductivity-type region and increases or remains constant locally at and around at least one deepness from the surface of the first-conductivity-type region.

The first-conductivity-type region may be formed by selective epitaxial growth at a growth temperature ranging from 500° C. to 700° C.

According to the present invention, there is also provided a semiconductor integrated circuit device having a variable-capacitance device according to the present invention.

A semiconductor integrated circuit device may have a variable-capacitance device according to the present invention and comprise an emitter-coupled logic circuit arrangement and an active pull-down circuit arrangement which are coupled to each other.

A semiconductor integrated circuit device may have at least two variable-capacitance devices according to the present invention, and the first-conductivity-type regions and the second-conductivity-type regions of the variable-capacitance devices may be joined to each other with different impurity concentrations.

The first-conductivity-type region may comprise an n-type diffusion layer, and the second-conductivity-type region may comprise a p-type diffusion layer.

With the above arrangement, the impurity concentration of the first-conductivity-type region varies in a direction perpendicular from the surface of the first-conductivity-type region such that the region where the capacitance varies to a large extent in response to the change in the impressed voltage applied to an anode electrode and the region where the capacitance remains substantially constant in response to the change in the impressed voltage applied to the anode electrode are alternately repeated. The variable-capacitance device can easily be fabricated on the semiconductor substrate. If the impressed voltage between the first-conductivity-type region and the second-conductivity-type region is selected such that the capacitance is a desired capacitance in a substantially constant region, then any change in the capacitance in response to a change in the impressed voltage can be reduced.

The semiconductor integrated circuit device according to the present invention has a plurality of variable-resistance devices which are formed on a semiconductor substrate without the need for a plurality of selective ion implantation processes using different mask patterns.

The above and other objects, features, and advantages of the present invention will become apparent from the following description when taken in conjunction with the accompanying drawings which illustrate preferred embodiments of the present invention by way of example.

BRIEF DESCRIPTION OF THE DRAWINGS

FIG. 1(A) is a graph showing impurity concentration profiles of a conventional variable-capacitance diode having a diffusion layer of a hyper abrupt junction;

FIG. 1(B) is a graph showing the relationship between the capacitance and the impressed voltage of the variable-capacitance diode shown in FIG. 1(A);

DETAILED DESCRIPTION OF THE PREFERRED EMBODIMENTS

Figure 2A:
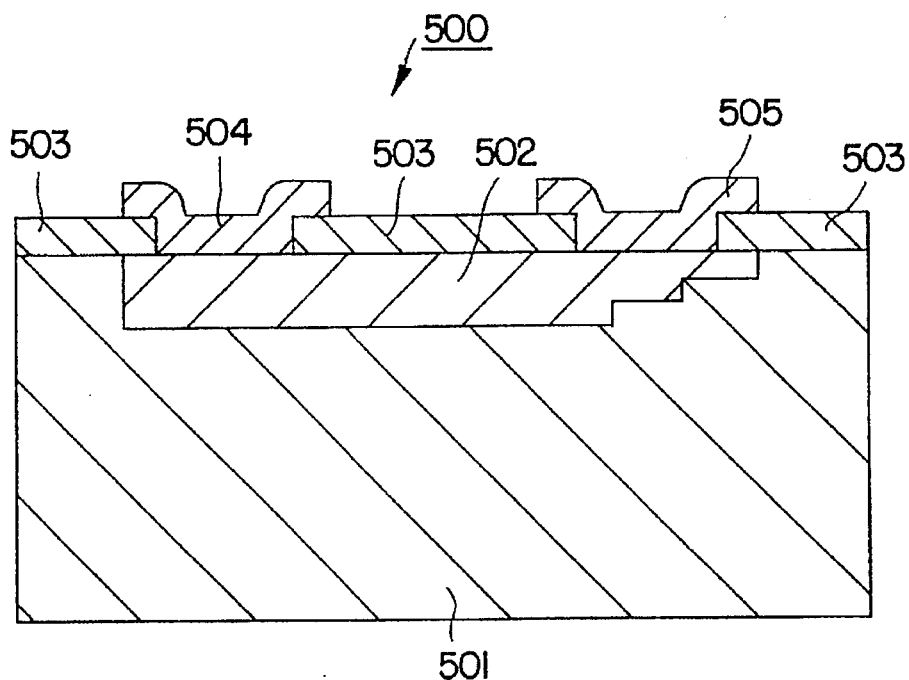
FIG. 2(A) is a cross-sectional view of a conventional variable-capacitance device.
Figure 2B:
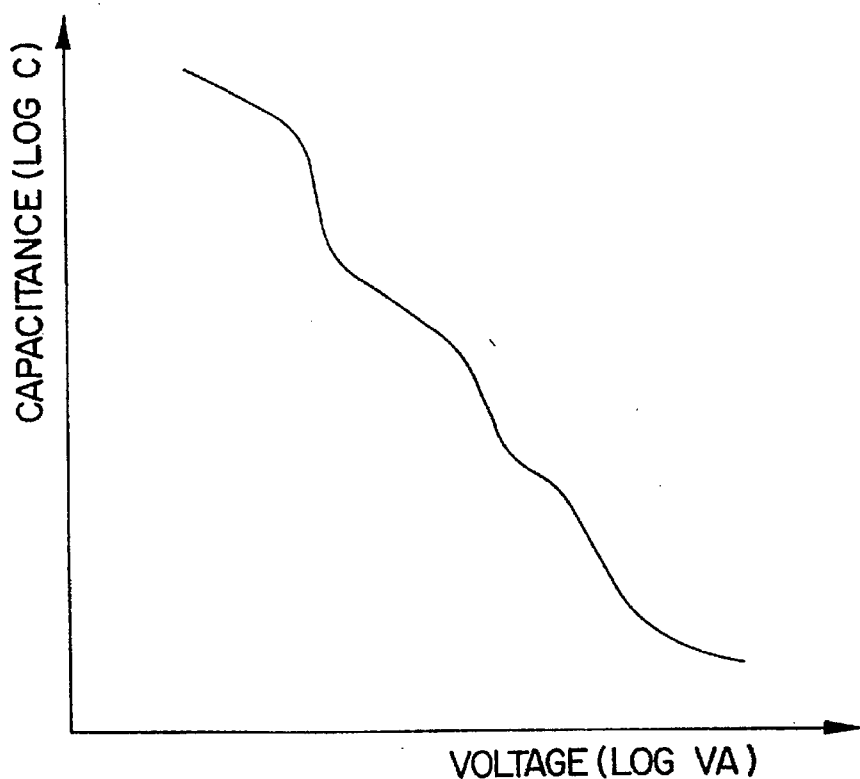
FIG. 2(B) is a graph showing the relationship between the capacitance and the anode voltage of the variable-capacitance device shown in FIG. 2(A)
Figure 3:
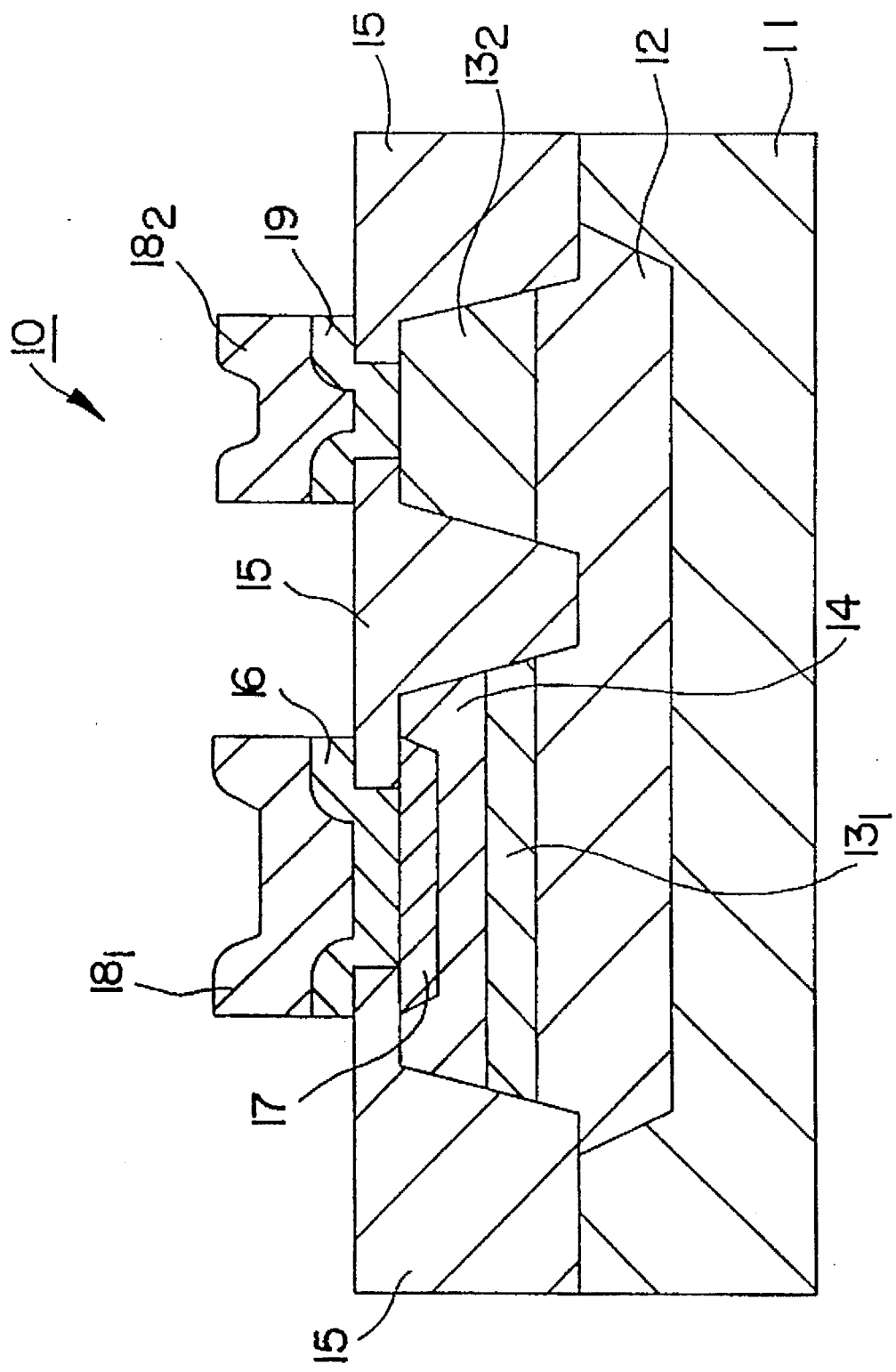
FIG. 3 is a cross-sectional view of a variable-capacitance device according to a first embodiment of the present invention.

FIG. 3 shows in cross section a variable-capacitance device according to a first embodiment of the present invention.

As shown in FIG. 3, the variable-capacitance device, generally denoted at 10, comprises a p-type silicon substrate 11, a buried $n^+$ region 12 formed in the p-type silicon substrate 11, a first n-type epitaxial growth layer $13_1$ formed on a left-hand region (as shown) of the buried $n^+$ region 12, a second n-type epitaxial growth layer $13_2$ formed on a right-hand region (as shown) of the buried $n^+$ region 12, an n-type diffusion layer 14 formed on the first n-type epitaxial growth layer $13_1$, a silicon oxide film 15 formed on the p-type silicon substrate 11, a p-type polycrystalline silicon film 16 formed on the n-type diffusion layer 14 through an opening defined in the silicon oxide film 15, a p-type diffusion layer 17 formed by diffusing boron atoms from the p-type polycrystalline silicon film 16 into the n-type diffusion layer 14, a first aluminum electrode $18_1$ formed on the p-type polycrystalline silicon film 16, an n-type polycrystalline silicon film 19 formed on the second n-type epitaxial growth layer $13_2$ through another opening defined in the silicon oxide film 15, and a second aluminum electrode $18_2$ formed on the n-type polycrystalline silicon film 19.

The buried $n^+$ region 12 is formed by an ion implanting process in which arsenic atoms are implanted into a portion of the p-type silicon substrate 11 to a concentration of about $10^{19}$ cm$^{-3}$. The buried n$^+$ region 12 has a thickness of about 2 µm. For example, the first n-type epitaxial growth layer 13$_1$ and the second n-type epitaxial growth layer 13$_2$ are formed to a thickness ranging from 0.5 µm to 3 µm with arsenic atom ions having a concentration of about $10^{16}$ cm$^{-3}$. The silicon oxide film 15 serves to separate adjacent device regions from each other and also to separate a lead region of the buried n$^+$ region 12 including the second aluminum electrode 18$_2$ from a capacitance-forming region including the first aluminum electrode 18$_1$. The diffused boron atoms of the p-type diffusion layer 17 have an impurity concentration of about $10^{20}$ cm$^{-3}$.

Figure 4A:
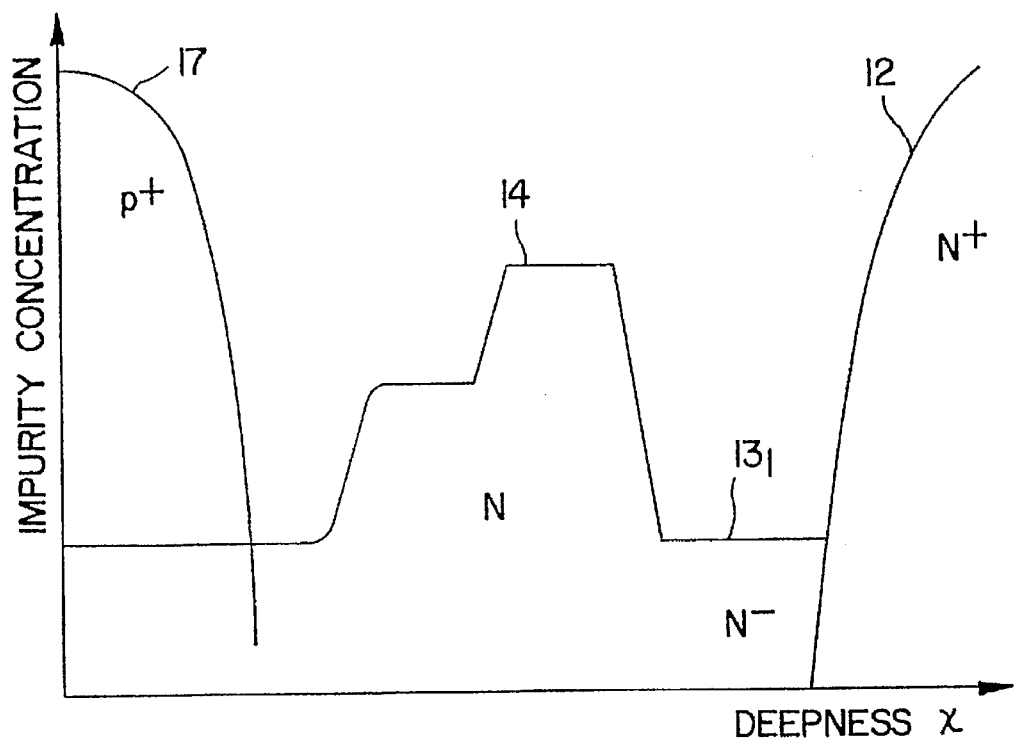
FIG. 4(A) is a graph showing impurity concentration profiles of the variable-capacitance device according to the first embodiment of the present invention.

FIG. 4(A) shows impurity concentration profiles of the capacitance-forming region of the variable-capacitance device 10. As shown in FIG. 4(A), the n-type diffusion layer 14 has such an impurity concentration profile that regions in which the impurity concentration is comparatively constant and regions in which the impurity concentration abruptly varies are alternately repeated, and the impurity concentration is greater as the deepness "x" from the surface of the n-type diffusion layer 14 increases. The impurity concentration profile of the n-type diffusion layer 14 may be achieved by either implanting n-type impurity atoms a plurality of times with different energies in an ion implantation process or varying the concentration of n-type impurity phosphorus atoms upon epitaxial layer growth.

Figure 4B:
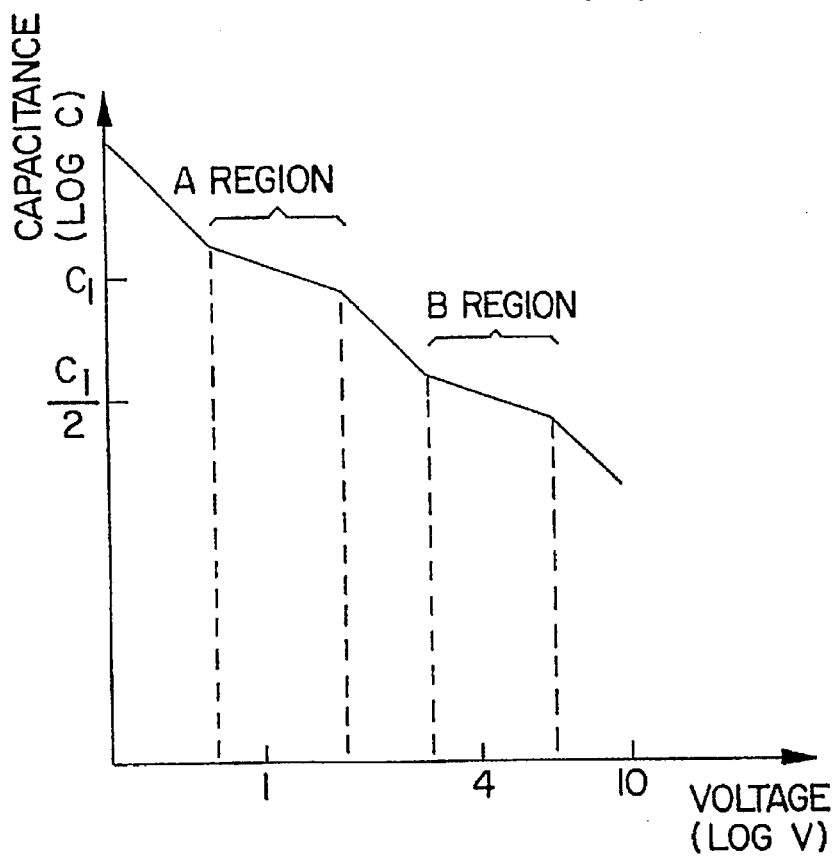
FIG. 4(B) is a graph showing the relationship between the capacitance and the impressed voltage of the variable-capacitance device according to the first embodiment of the present invention.

FIG. 4(B) shows the relationship between the capacitance C of the variable-capacitance device 10 and the impressed voltage V thereof. In FIG. 4(B), the abscissa and ordinate indicate logarithmic representations. As with the equation (1) above, the capacitance C at the time the voltage V is applied in a reverse direction (V<0) is expressed as follows:

$$C = C_D \cdot (V_D - V)^{-n} \quad (2)$$

where $C_D$ is a proportionality constant determined by the impurity concentration profile, and $V_D$ is the diffusion potential. If the density $N_D$ of donors is considerably smaller than the density $N_A$ of acceptors ($N_D \ll N_A$), then the proportionality constant $C_D$ is given as follows:

$$C_D = K_1 \cdot (N_D)^{1/2} \quad (3)$$

where $K_1$ is a proportionality constant. The exponent "n" is "½" for an abrupt junction. Therefore, the capacitance C falls in proportion to $(V_D-V)^{-\frac{1}{2}}$ as the impressed voltage V increases in the regions of the n-type diffusion layer 14 where the impurity concentration is flat, and falls in proportion to $(N_D)^{1/2}(V_D-V)^{-\frac{1}{2}} = \{N_D/(V_D-V)\}^{1/2}$ as the impressed voltage V increases in the regions of the n-type diffusion layer 14 where the impurity concentration abruptly varies. Consequently, the layer in which the impurity concentration abruptly varies is depleted at a speed which seemingly drops as the impressed voltage V varies, and hence the capacitance C thereof varies to a small extent, and the layer in which the impurity concentration is flat is depleted at a speed which seemingly rises as the impressed voltage V varies, and hence the capacitance C thereof varies to a large extent.

As shown in FIG. 4(B), therefore, the capacitance C decreases stepwise as the impressed voltage V increases. Regions A, B shown in FIG. 4(B) correspond respectively to the regions shown in FIG. 4(A) where the impurity concentration abruptly varies. In order to achieve capacitances $C_1$ and $C_1/2$ in one chip, the area in which the p-type diffusion layer 17 and the n-type diffusion layer 14 contact each other and the impurity concentration profile of the n-type diffusion layer 14 are required to be optimized. The capacitances $C_1$ and $C_1/2$ can be obtained in one chip by setting the area and the impurity concentration profile so that the capacitance C becomes $C_1$ when the impressed voltage V is V=$V_D$−1 [V] and becomes $C_1/2$ when the impressed voltage V is V=$V_D$−4 [V]. In the regions A, B, it is easy for the variable-capacitance device 10 to have a desired capacitance C because the capacitance C varies to a small extent in those regions as the impressed voltage V varies.

As described above, the variable-capacitance device 10 can have different stable capacitances in the same pattern in a circuit. If the present invention is applied to a gate-array circuit, then it is not necessary to provide the circuit with a plurality of diode patterns having different capacitances which have been selected in advance to match the circuit. Therefore, the principles of the present invention are useful in increasing the efficiency of designing gate-array circuit patterns.

A variable-capacitance device according to a second embodiment of the present invention will be described below together with its fabrication process with reference to FIGS. 5(A) through 5(C) and 6(A) and 6(B).

Figure 5A:
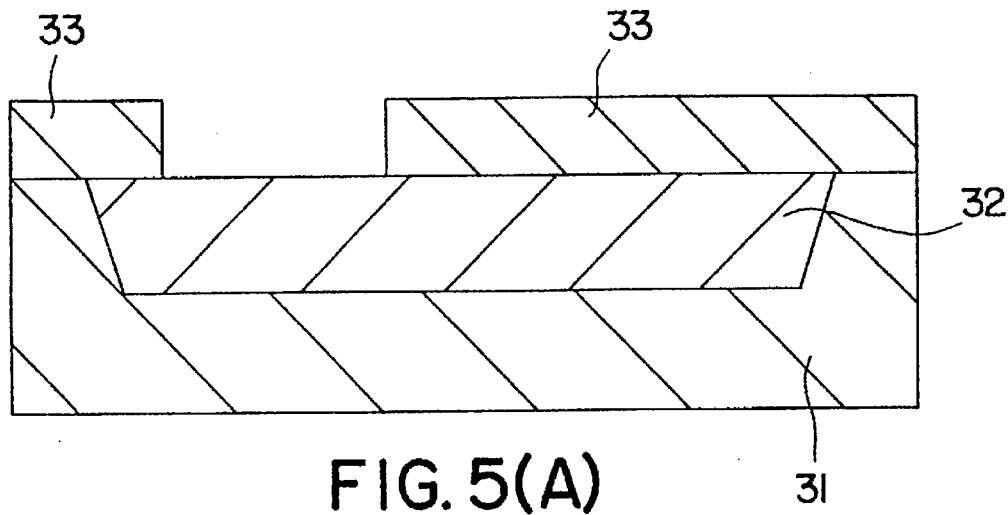
FIGS. 5(A), 5(B), and 5(C) are cross-sectional views illustrative of a process of fabricating a variable-capacitance device according to a second embodiment of the present invention.
Figure 5B:
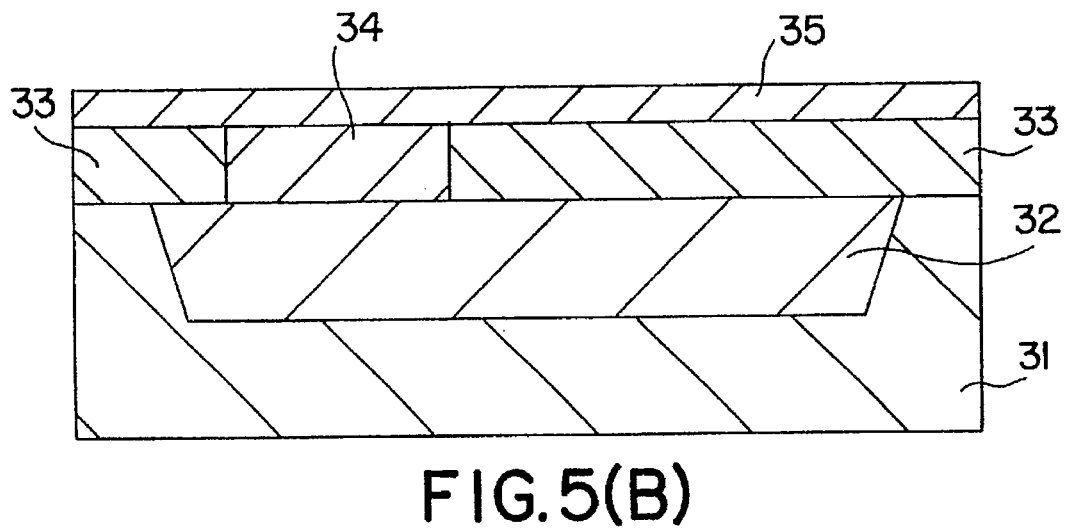
Figure 5C:
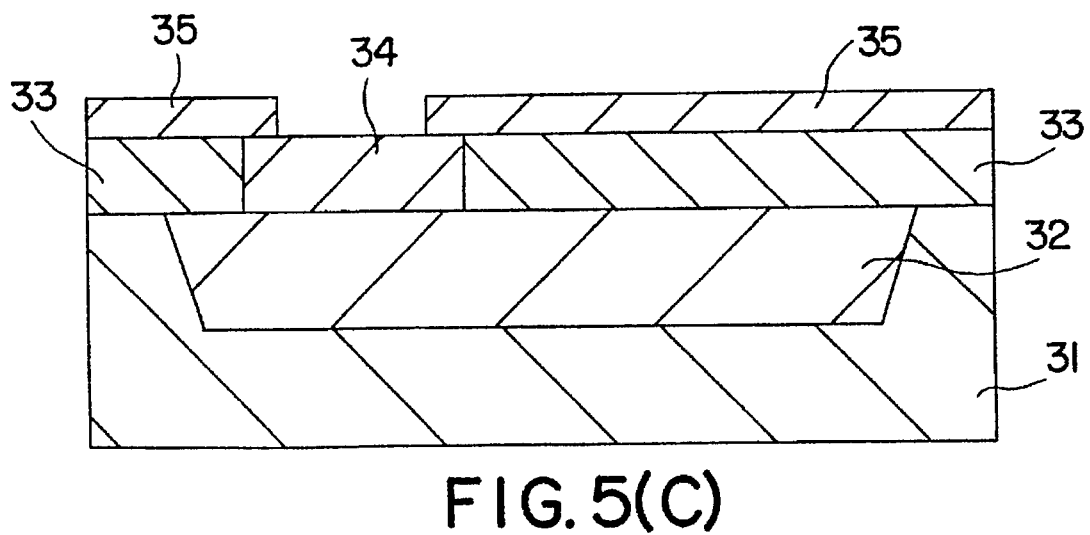

As shown in FIG. 5(A), a buried n$^+$ region 32 is formed in a p-type silicon substrate 31 by implanting As atoms having a concentration of about $10^{19}$ cm$^{-3}$ selectively in a portion of the p-type silicon substrate 31 according to an ion implantation process. Thereafter, a first silicon oxide film 33 having a thickness of about 200 nm is formed on the p-type silicon substrate 31 by thermal oxidation. Then, an opening is selectively formed in the first silicon oxide film 33 by photoetching, exposing the surface of a left-hand portion of the buried n$^+$ region 32 as shown in FIG. 5(A). By adding phosphorus atoms from phosphine, for example, an n-type diffusion layer 34 is formed on the exposed surface of the buried n$^+$ region 32 as shown in FIG. 5(B) at a growth temperature ranging from 500° C. to 700° C. according to an UHV/CVD (ultrahigh vacuum CVD) process. A second silicon oxide film 35 is then formed on the first silicon oxide film 33 and the n-type diffusion layer 34 according to a CVD process. Thereafter, an opening is selectively formed in the second silicon oxide film 35 by photoetching, as shown in FIG. 5(C), exposing a portion of the surface of n-type diffusion layer 34.

Figure 6A:
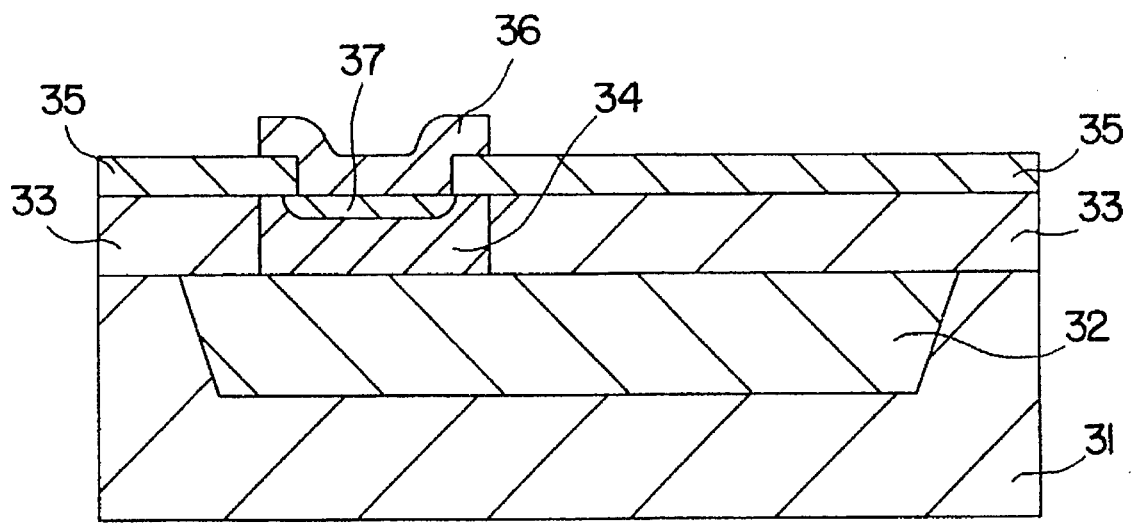
FIGS. 6(A) and 6(B) are cross-sectional views illustrative of fabrication steps subsequent to the fabrication process shown in FIGS. 5(A), 5(B), and 5(C)
Figure 6B:
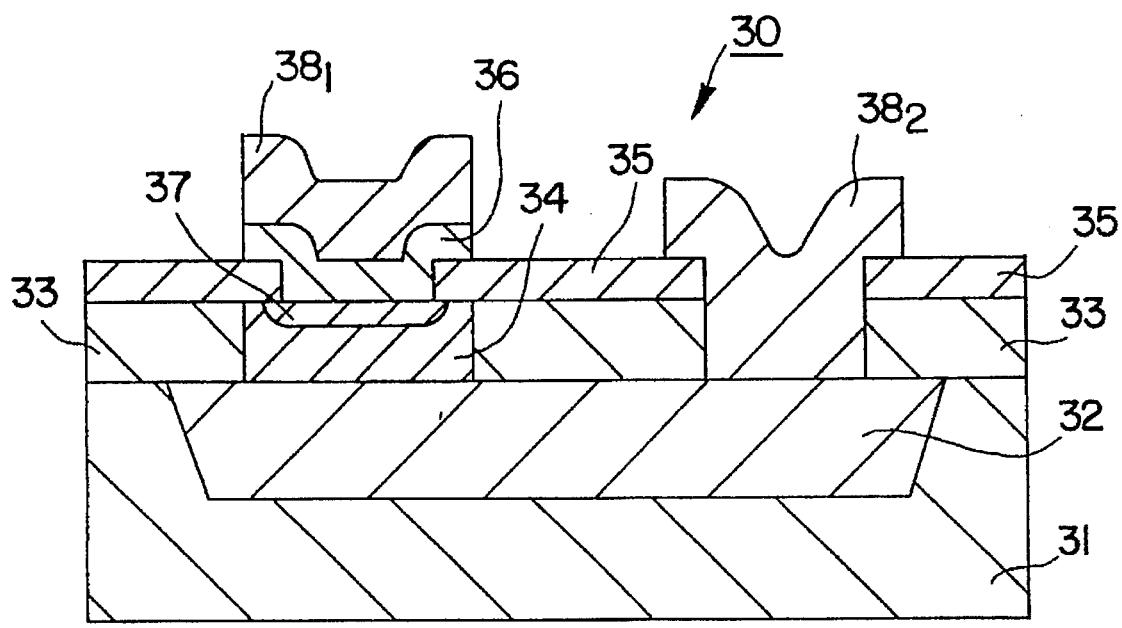

Subsequently, as shown in FIG. 6(A), a p-type polycrystalline silicon film 36 with boron atoms added at a concentration of $10^{20}$ cm$^{-3}$ is selectively formed on the exposed surface of the n-type diffusion layer 34 and a surrounding surface of the second silicon oxide film 35 according to CVD and photoetching processes. The assembly is then heated at 900° C. for 30 seconds, forming a p-type diffusion layer 37 in the n-type diffusion layer 34. Then, as shown in FIG. 6(B), an opening is selectively formed in the first silicon oxide film 33 and the second silicon oxide film 35, exposing the surface of a right-hand portion of the buried n$^+$ region 32. A first aluminum electrode 38$_1$ is selectively formed on the p-type polycrystalline silicon film 36, and a second first aluminum electrode 38$_2$ is selectively formed on the exposed surface of the buried n$^+$ region 32 and a surrounding surface of the second silicon oxide film 35. In this manner, a variable-capacitance device 30 is fabricated according to the above steps.

Figure 7A:
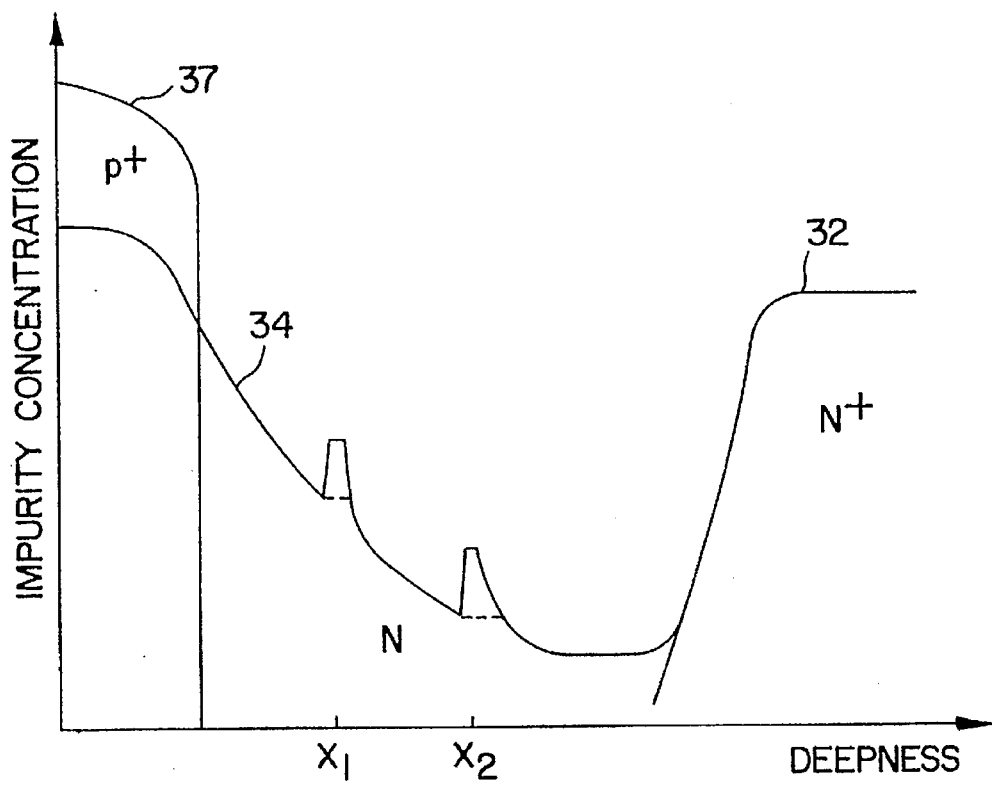
FIG. 7(A) is a graph showing impurity concentration profiles of the variable-capacitance device according to the second embodiment of the present invention.

In order to vary the capacitance to a large extent in response to a change in the impressed voltage in a smaller range than the impurity concentration profiles shown in FIG. 4(A), for achieving a stable capacitance in response to a change in the impressed voltage at a desired capacitance, the impurity concentration profile of the n-type diffusion layer 34 of the variable-capacitance device 30 is such that, as indicated by the solid-line curve in FIG. 7(A), the impurity concentration decreases as the deepness "x" from the surface of the n-type diffusion layer 34 increases, and increases locally at and around deepnesses "$x_1$", "$x_2$".

Figure 7B:
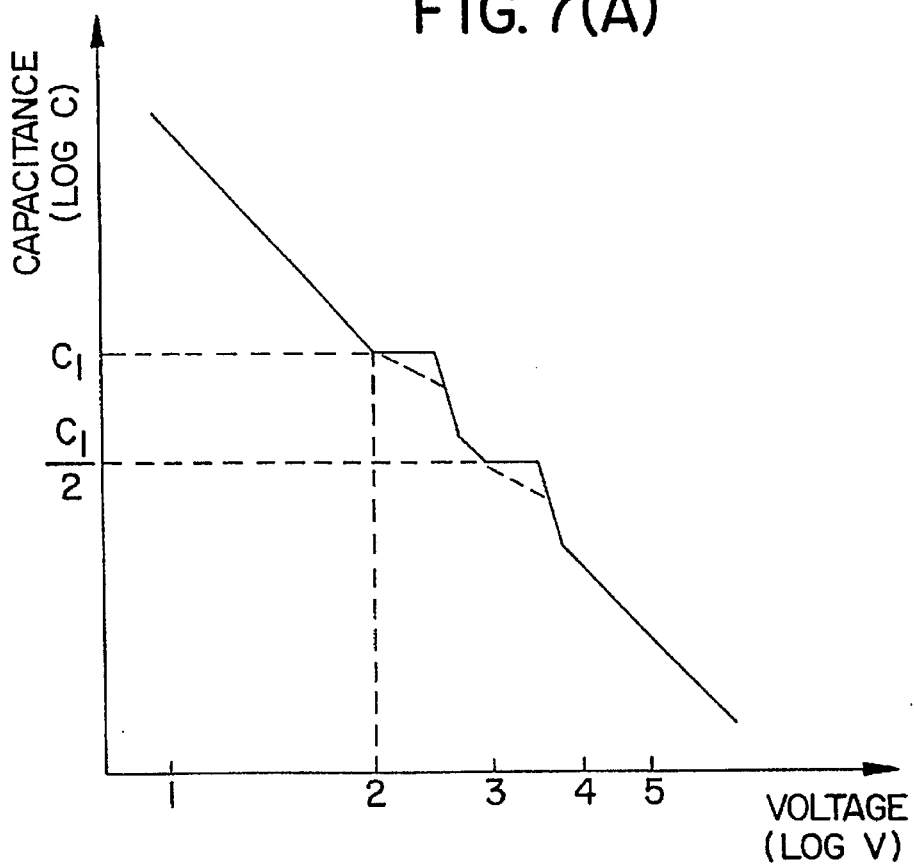
FIG. 7(B) is a graph showing the relationship between the capacitance and the impressed voltage of the variable-capacitance device according to the second embodiment of the present invention.

More specifically, the n-type diffusion layer 34 selectively formed according to the UHV/CVD process has a hyper abrupt junction in which the impurity concentration increases from buried $n^+$ region 32 toward the surface of the n-type diffusion layer 34. The impurity concentration of the n-type diffusion layer 34 is higher at and around the deepnesses "$x_1$", "$x_2$" from the surface of the p-type diffusion layer 37 which coincide respectively with deepnesses of the depletion layer where desired capacitances $C_1$, $C_1/2$ are obtained, than in surrounding regions. In the variable-capacitance device 30 having such a hyper abrupt junction, the capacitance C and the impressed voltage V satisfy the following relationship:

$$\log(C) = -2 \cdot \log(V_D - V) \quad (4),$$

and the gradient becomes "−2". Therefore, the capacitance C can be varied to a large extent when the impressed voltage V varies in a small range of several volts. As described above, the capacitance C is inversely proportional to the deepness of the depletion layer. The spreading of the depletion layer in response to a change in the impressed voltage is suppressed by locally varying the impurity concentration of the n-type diffusion layer 34 at and around the deepnesses "$x_1$", "$x_2$" from the surface of the p-type diffusion layer 37 at which the depletion layer spreading from the junction surface of the p-type diffusion layer 37 and the n-type diffusion layer 34 in response to the impressed voltage V gives desired capacitances $C_1$, $C_1/2$, respectively. As a result, as indicated by the solid-line curve in FIG. 7(B), any change in the capacitance C is almost "0" in response to a change in the impressed voltage V at the desired capacitances $C_1$, $C_1/2$.

In the above description, the impurity concentration of the n-type diffusion layer 34 is locally increased at and around the deepnesses "$x_1$", "$x_2$". However, as indicated by the broken lines in FIG. 7(A), the impurity concentration may be constant at and around the deepnesses "$x_1$", "$x_2$" of the n-type diffusion layer 34. With such a modification, as indicated by the broken lines in FIG. 7(B), any change in the capacitance C in response to a change in the impressed voltage V at the desired capacitances $C_1$, $C_1/2$ is smaller than in surrounding regions. The variable-capacitance device 30 according to the second embodiment offers the same advantages as the variable-capacitance device 10 according to the first embodiment even if the impurity concentration profile of the n-type diffusion layer 14 shown in FIG. 4(A) is used as the impurity concentration profile of the n-type diffusion layer 34.

In the variable-capacitance device 30 according to the second embodiment, no n-type epitaxial growth layer is formed on the buried $n^+$ region 32. However, an n-type epitaxial growth layer may be formed on the buried $n^+$ region 32 by epitaxial growth with n-type impurity atoms added in a concentration of about $10^{16}$ cm$^{-3}$.

In each of the variable-capacitance device according to the first and second embodiments as described above, the p-type diffusion layer of high impurity concentration and the n-type diffusion layer of low impurity concentration are formed over the surface of the p-type silicon substrate. However, the p- and n-types may be switched around. Each of the variable-capacitance device according to the first and second embodiments may have the same capacitance characteristics and offers the same advantages even if the deeper diffusion layer has a high impurity concentration and the shallower diffusion layer has a low impurity concentration.

Figure 8A:
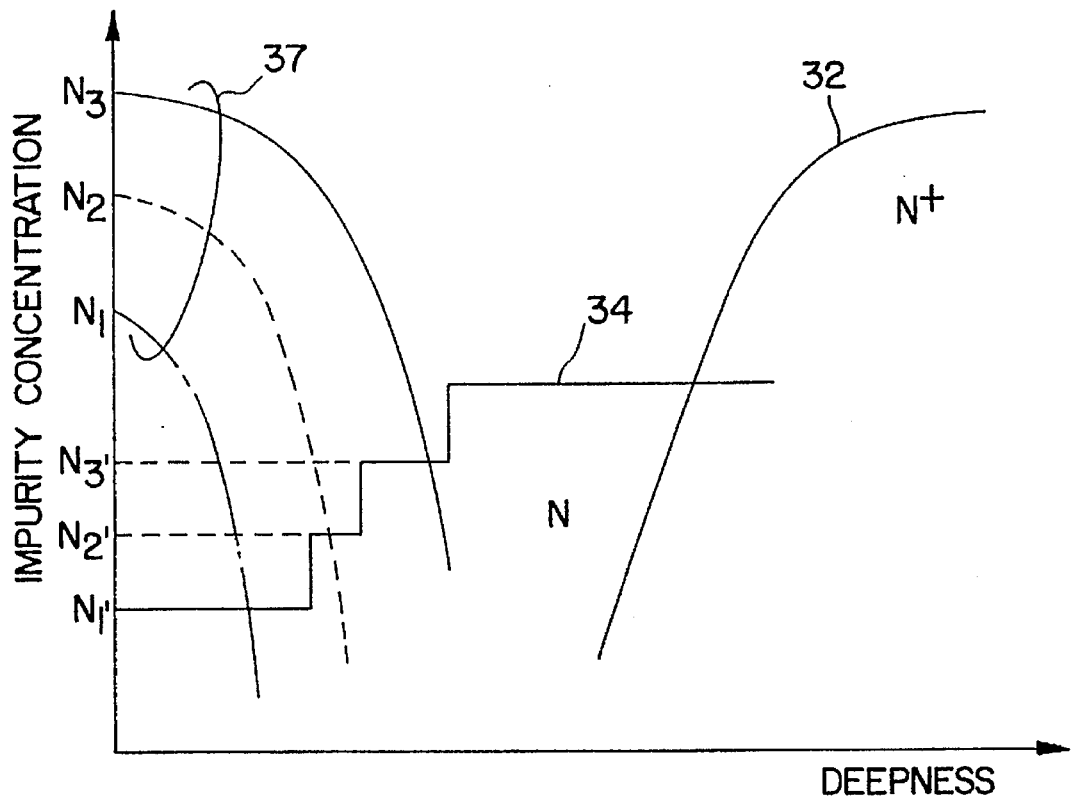
FIG. 8(A) is a graph showing impurity concentration profiles of variable-capacitance devices of a semiconductor integrated circuit device according to a first embodiment of the present invention.
Figure 8B:
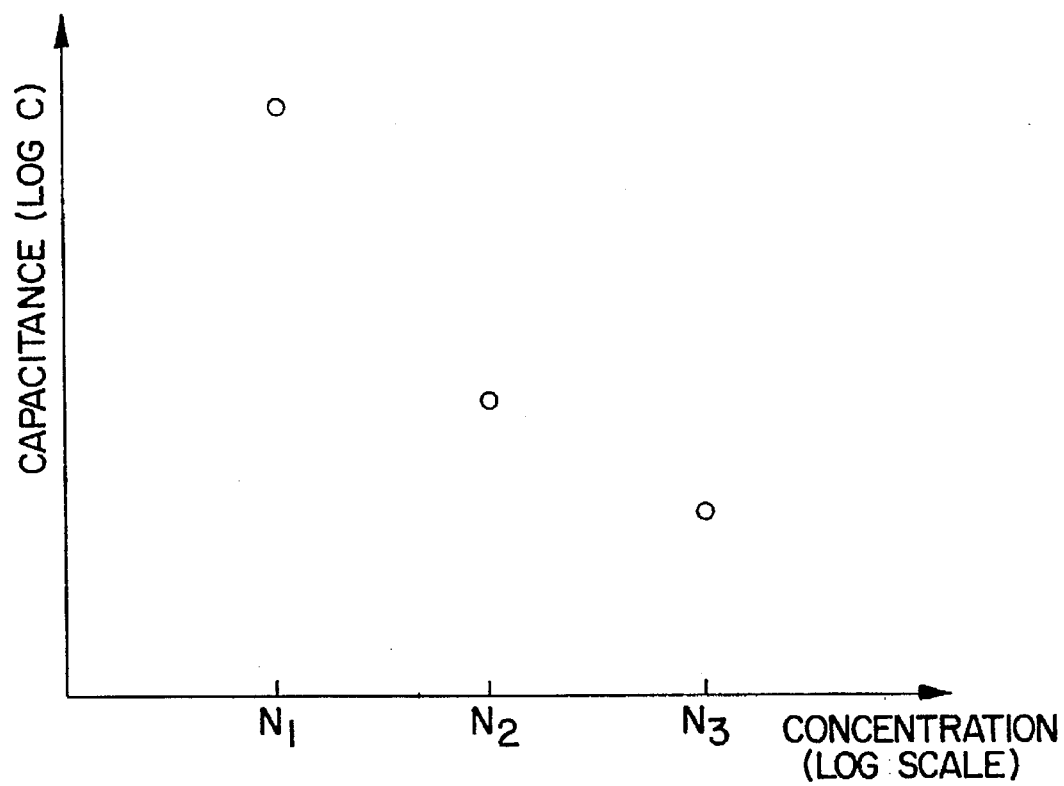
FIG. 8(B) is a graph showing the relationship between the capacitance and the boron atom concentration in a p-type polycrystalline silicon film of the semiconductor integrated circuit device according to the first embodiment of the present invention.

A semiconductor integrated circuit device according to a first embodiment of the present invention will be described below with reference to FIGS. 8(A) and 8(B). The semiconductor integrated circuit device according to the first embodiment has a plurality of variable-capacitance devices each identical in structure to the variable-capacitance device 30. Various parts of the variable-capacitance devices are therefore denoted by reference numerals which are identical to those of the variable-capacitance device 30.

The semiconductor integrated circuit device according to the first embodiment has the following features:

(1) When a plurality of variable-capacitance devices are fabricated in one chip, the variable-capacitance devices have respective p-type diffusion layers 37 having different impurity concentrations which are formed, by simultaneous heating, from p-type polycrystalline silicon films 36 having different boron atom concentrations, which serve as a diffusion source of p-type impurity atoms for the p-type diffusion layers 37, depending on respective desired capacitances C.

(2) The n-type diffusion layer 34 of each of the variable-capacitance devices has such an impurity concentration profile that the impurity concentration increases stepwise near its junction with the p-type diffusion layer 37 as the deepness "x" increases from the surface of the p-type diffusion layer 37.

More specifically, the p-type diffusion layers 37 having different impurity concentrations are formed in the same chip by simultaneous heating from the p-type polycrystalline silicon films 36 such that the boron atom concentrations in the p-type polycrystalline silicon films 36 become three respective different concentrations, i.e., concentrations $N_1$, $N_2$, $N_3$ ($N_1 < N_2 < N_3$), thereby fabricating three variable-capacitance devices having different capacitances C. Diffused deepnesses of the p-type diffusion layers 37 are selected to provide different impurity concentration profiles depending on the respective boron atom concentrations $N_1$, $N_2$, $N_3$ in the p-type polycrystalline silicon films 36. As a result, by causing the n-type diffusion layer 34 to have a stepped impurity concentration profile as shown in FIG. 8(A) to establish different boron atom concentrations $N'_1$, $N'_2$, $N'_3$ for the junctions with the p-type diffusion layers 37, the variable-capacitance devices 30 may have respective different capacitances C at the same impressed voltage V as shown in FIG. 8(B). Any change in the capacitance C in response to a change in the impressed voltage V may be reduced by equalizing the distance from the deepness from the junction between the p-type diffusion layer 37 and the n-type diffusion layer 34 to the deepness from the surface where the impurity concentration of the n-type diffusion layer 34 increases stepwise, to the deepness of the depletion layer in which the desired capacitance C is obtained, as with the variable-capacitance devices 10, 30 described above.

The variable-capacitance devices can be fabricated in the same process as the variable-capacitance device 30 according to the second embodiment. In the illustrated embodiment, the impurity concentration profile of the n-type diffusion layer 34 of the variable-capacitance device 30 is such that the impurity concentration increases stepwise as the deepness "x" increases. However, the impurity concentration in the n-type diffusion layer 34 is not limited to such an impurity concentration profile. The impurity concentration in the n-type diffusion layer 34 may be varied depending on the deepnesses of the diffusion surfaces of the p-type diffusion layers 37 for thereby providing different impurity concentration profiles, so that a plurality of variable-capacitance devices having different capacitances can easily be fabricated in the same chip using the same pattern.

Figure 9A:
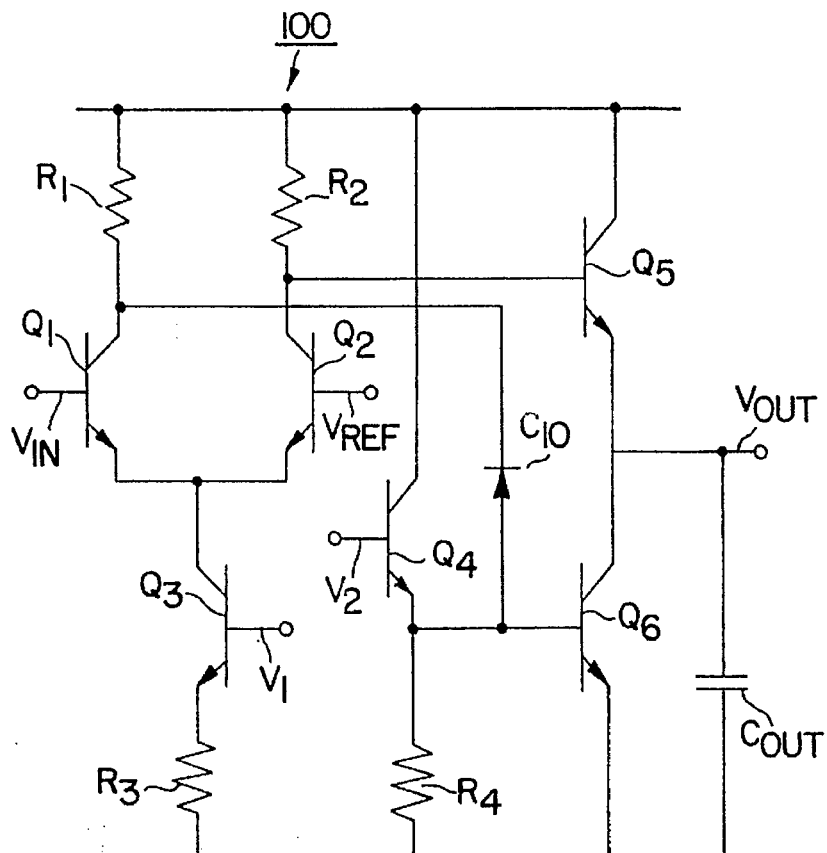
FIG. 9 is a circuit diagram of an emitter-coupled logic (ECL) circuit having an active pull-down (APD) circuit arrangement, as a semiconductor integrated circuit device according to a second embodiment of the present invention.
Figure 9B:
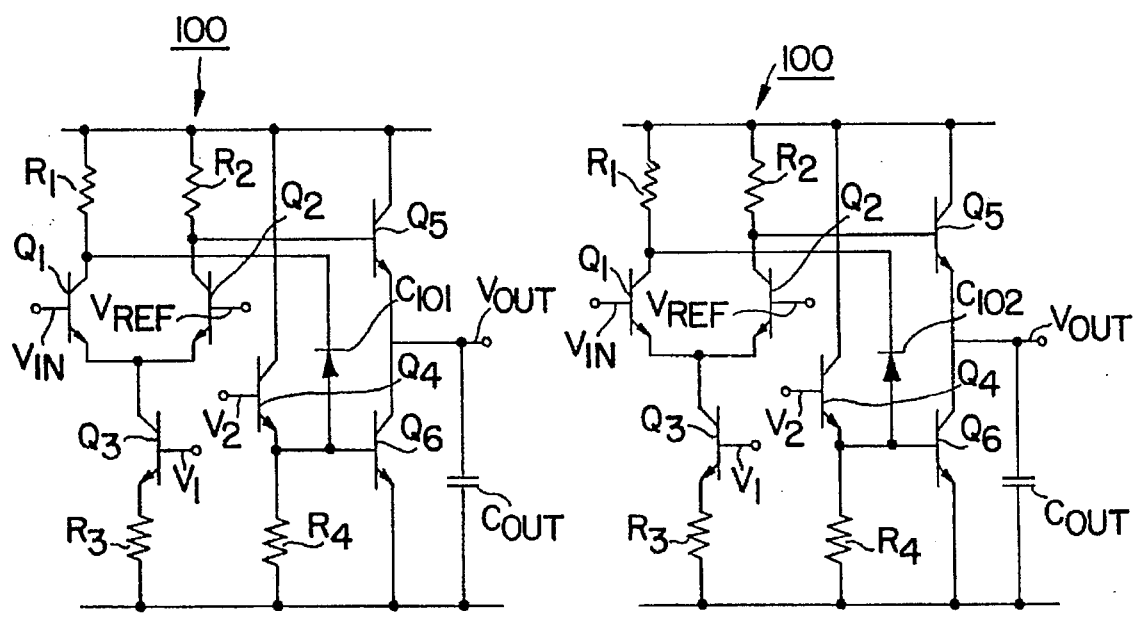

An APDECL circuit (Active Pull-Down Emitter-Coupled Logic circuit) as a semiconductor integrated circuit device according to a second embodiment of the present invention will be described below with reference to FIG. 9.

The APDECL circuit, generally denoted at 100, comprises an ECL circuit arrangement including a first transistor $Q_1$, a second transistor $Q_2$, a third transistor $Q_3$, a first resistor $R_1$, a second resistor $R_2$, and a third resistor $R_3$, and an APD circuit arrangement including a fourth transistor $Q_4$, a fifth transistor $Q_5$, a sixth transistor $Q_6$, a fourth resistor $R_4$, and a capacitor $C_{10}$ which is a variable-capacitance device according to the present invention. An input voltage $V_{IN}$ is applied to the base of the first transistor $Q_1$. A reference voltage $V_{REF}$ is applied to the base of the second transistor $Q_2$. A first bias voltage $V_1$ is applied to the base of the third transistor $Q_3$. A second bias voltage $V_2$ is applied to the base of the fourth transistor $Q_4$. The fifth transistor $Q_5$ has a base connected to the junction between the second resistor $R_2$ and the collector of the second transistor $Q_2$. The sixth transistor $Q_6$ (APD transistor) has a base connected through the capacitor $C_{10}$ to the junction between the first resistor $R_1$ and the collector of the first transistor $Q_1$. The base of the sixth transistor $Q_6$ is also connected to the emitter of the fourth transistor $Q_4$. An output signal $V_{OUT}$ is outputted from the junction between the emitter of the fifth transistor $Q_5$ and the collector of the sixth transistor $Q_6$. A parasitic loaded capacitance $C_{OUT}$ is connected between the emitter and collector of the sixth transistor $Q_6$.

When subjected to a voltage change due to a logic swing of the ECL circuit arrangement, the base potential of the sixth transistor $Q_6$ is temporarily increased, causing the parasitic loaded capacitance $C_{OUT}$ to quickly discharge a collector current of the sixth transistor $Q_6$. The capacitor $C_{10}$ serves to determine a time for increasing the base potential of the sixth transistor $Q_6$. If the capacitances of the capacitor $C_{10}$ were too small, the base potential of the sixth transistor $Q_6$ would drop before the discharging of the parasitic loaded capacitance $C_{OUT}$ is completed, failing to quickly discharge the parasitic loaded capacitance $C_{OUT}$. If the capacitances of the capacitor $C_{10}$ were too large, the base potential of the sixth transistor $Q_6$ would remain high or the capacitor $C_{10}$ would act as a parasitic capacitance even after the parasitic loaded capacitance $C_{OUT}$ is fully discharged, resulting in a lower circuit speed. Since the capacitance of the capacitor $C_{10}$ is, therefore, required to be optimized for the parasitic loaded capacitance $C_{OUT}$, it is necessary to optimize the capacitance of the capacitor $C_{10}$ for the parasitic loaded capacitance $C_{OUT}$ particularly if the parasitic loaded capacitance $C_{OUT}$, i.e., the interconnection length, is of different values as in a gate array.

In the APDECL circuit, the capacitor $C_{10}$ comprises a variable-capacitance device according to the present invention. Therefore, it is not necessary to have available capacitance patterns corresponding to different parasitic loaded capacitance $C_{OUT}$, i.e., different interconnection lengths. As a consequence, minute pattern designs can be made in the circuit layout. The ECL circuit has a logic amplitude in the range of from 400 mV to 500 mV. Since the capacitor $C_{10}$ which comprises a variable-capacitance device according to the present invention is substantially free from capacitance changes due to such a logic amplitude, the capacitor $C_{10}$ is effective to operate the APDECL circuit stably. In the example shown in FIG. 7(B), for example, when the impressed voltage V varies in the range of from 2 V to 2.5 V, the capacitance would vary about 36% with the conventional hyper abrupt junction, but varies about 0 to 17% with the capacitor $C_{10}$ which comprises a variable-capacitance device according to the present invention. Therefore, the change in the capacitance of the capacitor $C_{10}$ is reduced to ½ or less of the change in the capacitance of the conventional arrangement.

The present invention offers the following advantages:

The variable-capacitance device according to the present invention can easily be fabricated on a semiconductor substrate, and any change in the capacitance of the variable-capacitance device in response to a change in the impressed voltage can be reduced. Therefore, the stability of the capacitance of the variable-capacitance device is increased. The variable-capacitance device according to the present invention gives an impurity concentration profile a change such as a concentration increase at the deepness of a depletion layer at which a desired capacitance can be obtained in a direction to spread the depletion layer as the impressed voltage increases, thereby to obtain a range of impressed voltages in which the capacitance remains substantially constant even when the impressed voltage varies.

The semiconductor integrated circuit device according to the present invention has a plurality of variable-resistance devices which are formed on a semiconductor substrate without the need for a plurality of selective ion implantation processes using different mask patterns. Therefore, it is easy to fabricate the semiconductor integrated circuit device according to the present invention on the semiconductor substrate. By incorporating junction deepnesses and pn junction impurity concentrations in different variable-resistance devices in one chip, it is possible to obtain different capacitances with the same impressed voltage. Consequently, the semiconductor integrated circuit device according to the present invention is useful as a gate array where desired different capacitances are needed in one circuit.

It is to be understood, however, that although the characteristics and advantages of the present invention have been set forth in the foregoing description, the disclosure is illustrative only, and changes may be made in the shape, size, and arrangement of the parts within the scope of the appended claims.

What is claimed is:

1. A process of preparing a variable-capacitance device on a semiconductor substrate comprising the steps of:

disposing a first-conductivity-type region on said semiconductor substrate;

disposing a second-conductivity-type region on said first-conductivity-type region;

forming a junction between said first and second-conductivity-type regions, said first-conductivity-type region and second-conductivity-type region having a capacitance variable in response to a change in voltage applied thereto;

growing epitaxially said first-conductivity-type region having an impurity concentration which varies perpendicularly in a depth direction from a junction surface of the first-conductivity-type region and the second-conductivity-type region, and the first-conductivity-type region such that a region where the capacitance varies to a large extent in response to the change in applied voltage and a region where the capacitance remains substantially constant in response to the change in applied voltage are alternately repeated;

forming said first-conductivity-type region at a predetermined growth temperature ranging from 500° C. to 700° C.;

wherein, in said growing step, said first conductivity-type region is grown to have an impurity concentration which decreases continuously in a perpendicularly depth direction from a junction surface of the first-conductivity-type region and the second-conductivity-type region, and one of increases and remains constant locally at and around at least one deepness from the junction surface of the first-conductivity-type region.

2. A variable-capacitance device prepared by the process of claim 1; wherein, in said growing step, said first-conductivity-type region is grown to have an impurity concentration which increases stepwise perpendicularly in a depth direction from a junction surface of the first conductivity-type region and the second-conductivity-type region.

* * * * *